United States Patent
Yamada et al.

(10) Patent No.: US 12,349,479 B2
(45) Date of Patent: Jul. 1, 2025

(54) METHOD OF MANUFACTURING DISPLAY DEVICE

(71) Applicant: SHARP KABUSHIKI KAISHA, Sakai (JP)

(72) Inventors: Hirohisa Yamada, Sakai (JP); Keisuke Kitano, Sakai (JP); Yusuke Sakakibara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 486 days.

(21) Appl. No.: 17/914,334

(22) PCT Filed: Apr. 8, 2020

(86) PCT No.: PCT/JP2020/015806
§ 371 (c)(1),
(2) Date: Sep. 24, 2022

(87) PCT Pub. No.: WO2021/205563
PCT Pub. Date: Oct. 14, 2021

(65) Prior Publication Data
US 2023/0113212 A1    Apr. 13, 2023

(51) Int. Cl.
*H01L 33/06* (2010.01)
*G01R 19/00* (2006.01)
*H01L 27/146* (2006.01)
*H10F 39/18* (2025.01)
(Continued)

(52) U.S. Cl.
CPC ....... *H10F 39/182* (2025.01); *G01R 19/0046* (2013.01); *H10H 20/812* (2025.01); *H10K 59/123* (2023.02)

(58) Field of Classification Search
CPC ... H10F 39/182; H10F 39/18; G01R 19/0046; G01R 19/00; G01R 31/2635; G01R 31/44; H10K 59/123; H10K 59/35; G09G 2310/0259; G09G 2310/066; G09G 3/32; G09G 2300/0842; G09G 2320/0233; G09G 2320/0238; G09G 2320/0295; G09G 2330/10; G09G 2330/12; G09G 3/006; G09G 3/00; H01L 25/167; H01L 25/16; G09F 9/00; G09F 9/30; G09F 11/00;
(Continued)

(56) References Cited

U.S. PATENT DOCUMENTS 11,467,144 B2 * 10/2022 Takagi ............... G01N 33/0006
2020/0309752 A1 * 10/2020 Takagi ................. G01N 33/004

FOREIGN PATENT DOCUMENTS

JP    2006-266750 A    10/2006

* cited by examiner

*Primary Examiner* — Nikolay K Yushin
(74) *Attorney, Agent, or Firm* — ScienBiziP, P.C.

(57) ABSTRACT

A method of manufacturing a display device includes: the measurement step of sweeping a voltage to light-emitting elements and measuring a current value that flows in the light-emitting elements in response to a voltage value applied; the computation step of computing a first derivative value of the current value with respect to the voltage value, the first derivative value representing voltage dependence of a first derivative of the current value; the peak determination step of determining a peak of the first derivative value; the processing step of processing the light-emitting elements based on a result of the peak determination step; and the attaching step of attaching a housing to the substrate.

8 Claims, 9 Drawing Sheets

(51) Int. Cl.
*H10H 20/812* (2025.01)
*H10K 59/123* (2023.01)

(58) Field of Classification Search
CPC . G06C 1/00; G06G 1/00; H05B 33/10; H05B 33/12; H05B 33/14
See application file for complete search history.

| SUBPIXEL | RESULT OF S16 | DATA SIGNAL |
|---|---|---|
| R | NON-LIGHT-EMITTING ELEMENT | 0 |
| G | LIGHT-EMISSION-CAPABLE ELEMENT | 3 |
| B | LIGHT-EMISSION-CAPABLE ELEMENT | 4 |

| SUBPIXEL | RESULT OF S16 | DATA SIGNAL |
|---|---|---|
| R | NON-LIGHT-EMITTING ELEMENT | 0 |
| G | LIGHT-EMISSION-CAPABLE ELEMENT | 0 |
| B | LIGHT-EMISSION-CAPABLE ELEMENT | 0 |

FIG. 15
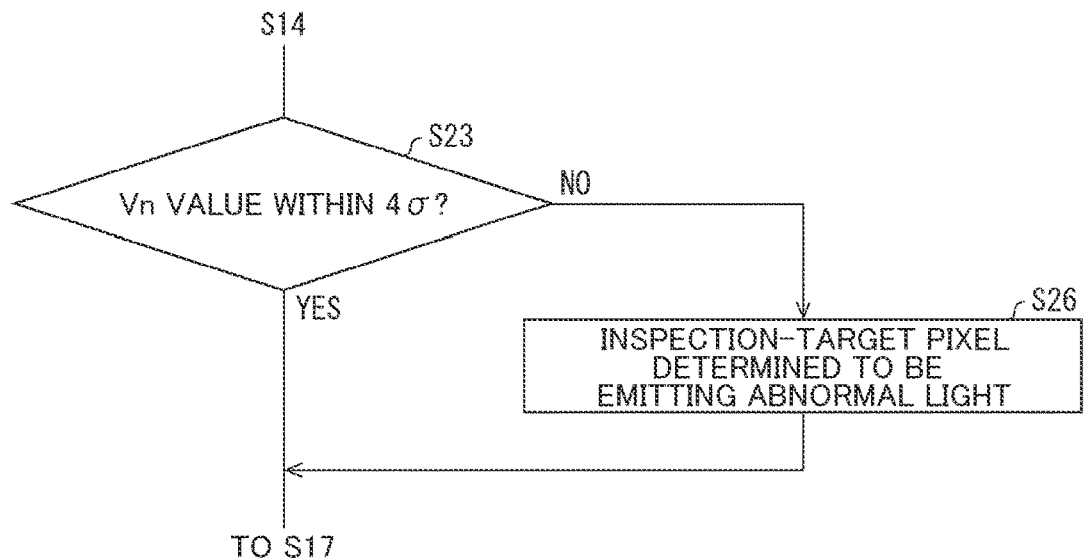
FIG. 16
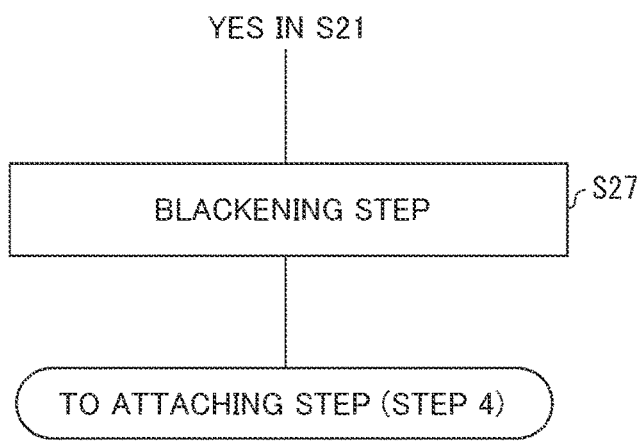
FIG. 17
| SUBPIXEL | RESULT OF S23 | DATA SIGNAL |
|---|---|---|
| R | ABNORMAL LIGHT-EMITTING ELEMENT | 0 |
| G | NORMAL LIGHT-EMITTING ELEMENT | 3 |
| B | NORMAL LIGHT-EMITTING ELEMENT | 4 |

FIG. 18

| SUBPIXEL | RESULT OF S23 | DATA SIGNAL |
|---|---|---|
| R | ABNORMAL LIGHT-EMITTING ELEMENT | 0 |
| G | NORMAL LIGHT-EMITTING ELEMENT | 0 |
| B | NORMAL LIGHT-EMITTING ELEMENT | 0 |

METHOD OF MANUFACTURING DISPLAY DEVICE

TECHNICAL FIELD

The disclosure relates to methods of manufacturing a display device including light-emitting elements.

BACKGROUND ART

Display devices including pixels are inspected with all pixels being turned on and supplied with suitable electric power, before being shipped out. Then, the light-emitting elements in the display device are optically inspected to find whether or not all the light-emitting elements are operating normally. It is particularly important to check whether there are any luminance irregularities among the light-emitting elements and additionally whether there are any defective pixels that can develop from, for example, dark spots, bright spots, or linear defects.

Defective pixels are typically detected by relative luminance measurement on the light-emitting elements under a CCD (charge coupled device) camera before the display device is shipped (Patent Literature 1).

CITATION LIST

Patent Literature

Patent Literature 1: Japanese Unexamined Patent Application Publication, Tokukai, No. 2006-266750 (Publication Date: Oct. 5, 2006)

SUMMARY

Technical Problem

However, the optical inspection described in Patent Literature 1 faces increasing difficulty in identifying defective pixels that can develop from, for example, dark spots and bright spots on a subpixel-to-subpixel basis with the progress of high definition design of the display device and the accompanying downsizing of the pixels.

In addition, in the optical inspection described in Patent Literature 1, if luminance irregularities and defective pixels are to be detected by luminance measurement under a CCD camera before shipping, there is an undesirable need to change optical systems for the optical inspection in accordance with the panel size and pixel size of the display device. There is also a need for a device evaluating results of the optical inspection that involves use of a CCD camera or a like luminance sensor, which leads to unfavorably high cost.

Solution to Problem

To address these problems, the disclosure, in an aspect thereof, is directed to a method of manufacturing a display device, the method including: the thin film transistor forming step of forming thin film transistors on a substrate; the light-emitting element forming step of forming light-emitting elements on the thin film transistors, the light-emitting elements including an anode, a light-emitting layer, and a cathode; and the inspection step of inspecting the light-emitting elements, the inspection step including: the measurement step of sweeping a voltage to the light-emitting elements and measuring a current value that flows in the light-emitting elements in response to a voltage value applied; the computation step of computing a first derivative value of the current value with respect to the voltage value, the first derivative value representing voltage dependence of a first derivative of the current value; the peak determination step of determining a peak of the first derivative value; the processing step of processing the light-emitting elements based on a result of the peak determination step; and the attaching step of attaching a housing to the substrate.

Advantageous Effects of Disclosure

The disclosure, in an aspect thereof, enables light-on inspection of light-emitting elements in downsized pixels at a low cost.

BRIEF DESCRIPTION OF DRAWINGS

FIG. 15 is a diagram showing details of the flow chart.

FIG. 16 is a flow chart representing a blackening step in accordance with Embodiment 2.

FIG. 17 is a diagram showing a method for the blackening step in accordance with Embodiment 2.

FIG. 18 is a diagram showing a method for the blackening step in accordance with Embodiment 2.

DESCRIPTION OF EMBODIMENTS

Embodiment 1

Figure 1:
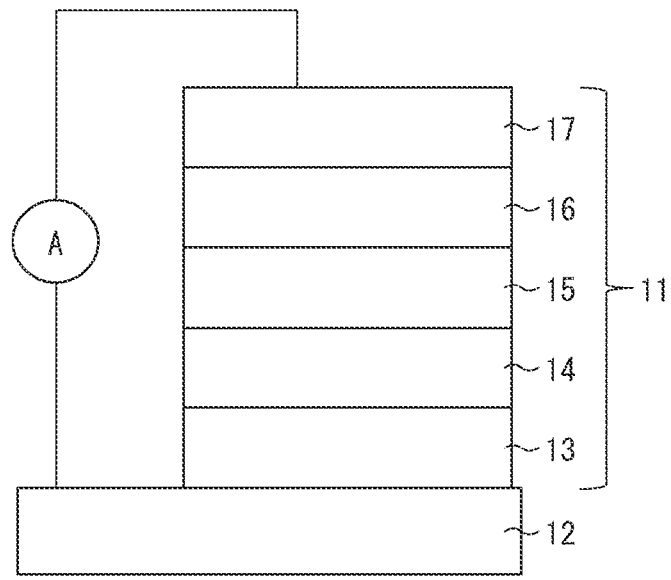
FIG. 1 is a cross-sectional view of a light-emitting element in accordance with Embodiment 1.

FIG. 1 is a cross-sectional view of a light-emitting element 11 in accordance with Embodiment 1. The light-emitting element 11 has a structure including a stack of layers of the light-emitting element 11 on an array substrate 12 in which thin film transistors (TFTs, not shown) are formed. The light-emitting element 11 includes an anode 13, a hole transport layer (HTL) 14, a light-emitting layer 15, an electron transport layer (ETL) 16, and a cathode 17, all of which are provided on the array substrate 12 in this order when viewed from below. The anode 13 formed on the array substrate 12 is electrically connected to a thin film transistor in the array substrate 12. The anode 13 and the cathode 17 contain a conductive material and are electrically connected respectively to the hole transport layer 14 and the electron transport layer 16. The anode 13 and the cathode 17 may be transposed in the present embodiment.

Either one of the anode 13 and the cathode 17 is a transparent electrode. The transparent electrode may be made of, for example, ITO, IZO, ZnO, AZO, BZO, or FTO by, for example, sputtering. The anode 13 or the cathode 17 may contain a metal material. The metal material is preferably a single metal such as Al, Cu, Au, Ag, or Mg, all of which have a high reflectance to visible light, or an alloy of any of these metals.

The hole transport layer 14 is not limited in any particular manner so long as the hole transport layer 14 contains a hole transport material capable of stably transporting holes to the light-emitting layer 15. In particular, the hole transport material preferably has a high hole mobility. Additionally, the hole transport material is preferably an electron-blocking material capable of preventing the electrons coming from the cathode 17 from passing through because this can increase the hole-electron recombination efficiency in the light-emitting layer 15.

The hole transport layer 14 may be made of, for example, an arylamine derivative, an anthracene derivative, a carbazole derivative, a thiophene derivative, a fluorene derivative, a distyryl benzene derivative, or a Spiro compound. Note that the hole transport layer 14 is more preferably made of polyvinyl carbazole (PVK) or poly[(9,9-dioctylfluorenyl-2, 7-diyl)-co-(4,4'-(N-(4-sec-butylphenyl))diphenylamine)] (TFB). Because PVK and TFB improve the efficiency of light emission caused by the recombination of electrons and holes in the light-emitting layer 15 containing quantum dots, PVK and TFB advantageously improve the luminescence properties of electroluminescence elements.

In addition, there may be provided a hole injection layer (not shown) between the anode 13 and the hole transport layer 14. This hole injection layer may be made of any hole injecting material so long as the hole injecting material is capable of stably inject holes to the light-emitting layer 15. The hole injecting material may be, for example, an arylamine derivative, a porphyrin derivative, a phthalocyanine derivative, a carbazole derivative, additionally, a conductive polymer such as a polyaniline derivative, a polythiophene derivative, or a polyphenylene vinylene derivative.

Figure 2:
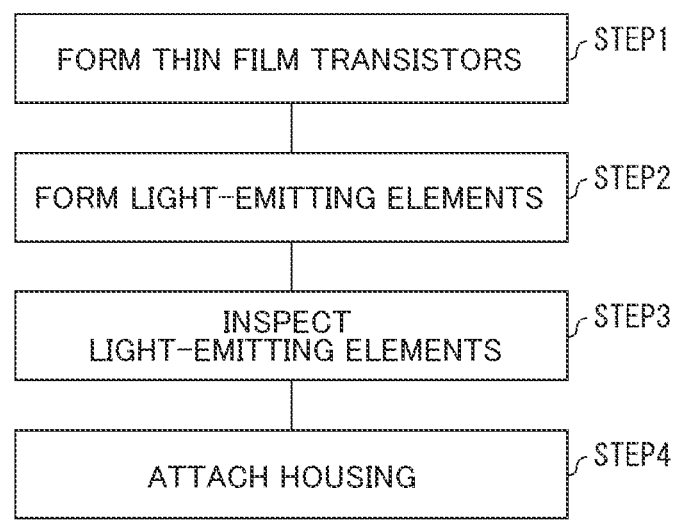
FIG. 2 is a flow chart representing a process of manufacturing the display device.

FIG. 2 is a flow chart representing a process of manufacturing a display device including the light-emitting element 11. First, a thin film transistor forming step is performed whereby thin film transistors are formed in the array substrate 12 (STEP 1). A light-emitting element forming step is then performed whereby the light-emitting element 11 containing the anode 13, the hole transport layer 14, the light-emitting layer 15, the electron transport layer 16, and the cathode 17 are formed on the array substrate 12 including the thin film transistors formed therein (STEP 2).

Next, after forming the light-emitting element 11, an inspection step is performed whereby the light-emitting element 11 is inspected (STEP 3). Thereafter, an attaching step is performed whereby a housing is attached to the array substrate 12 (STEP 4).

Figure 3:
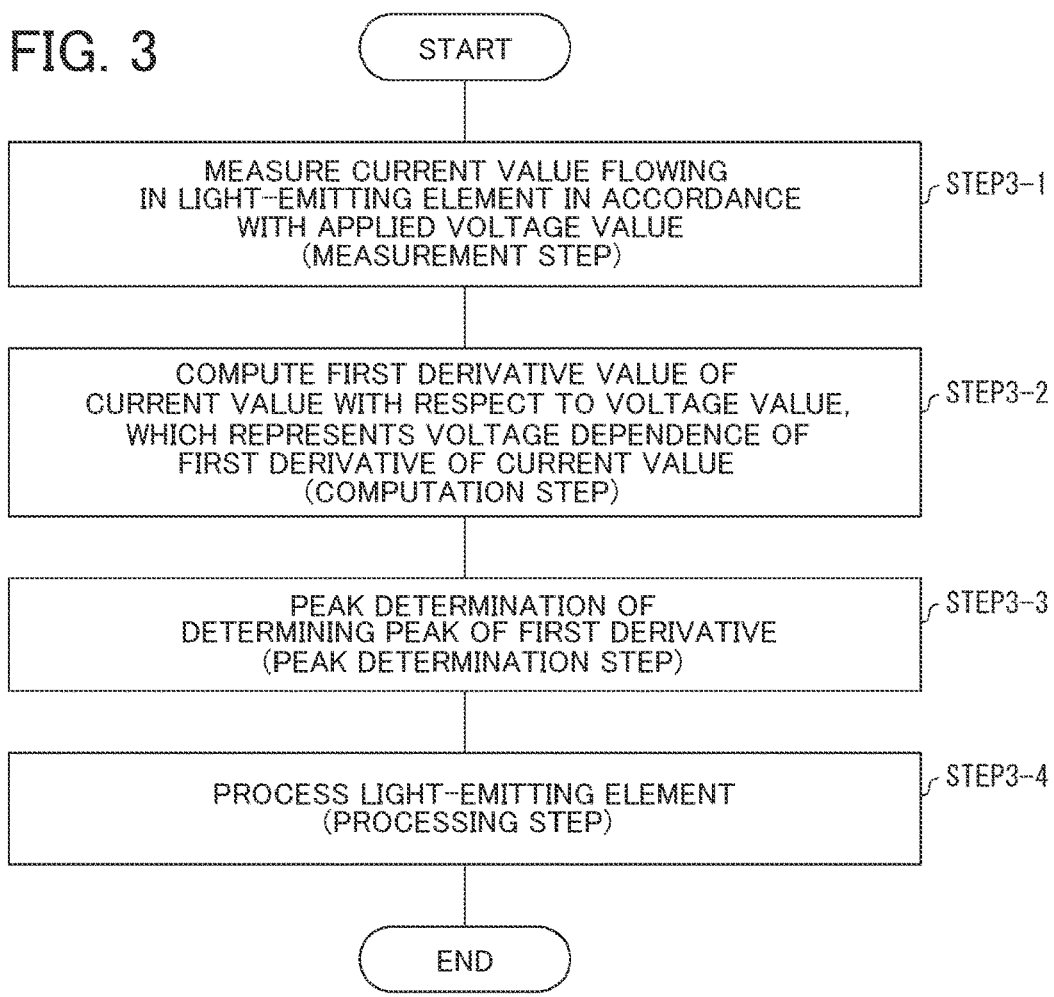
FIG. 3 is a flow chart representing a light-on inspection process for a light-emitting element in the manufacturing process.

FIG. 3 is a flow chart representing a light-on inspection process for the light-emitting element 11 in the manufacturing process described here. This light-on inspection refers to the inspection of the light-on state of the light-emitting element 11. The inspection step (STEP 3) includes the following steps.

First, a measurement step is performed whereby: a voltage greater than or equal to a prescribed value that is determined in advance is swept to the light-emitting element 11; and the current value that flows in the light-emitting element 11 in response to the applied voltage value is measured (STEP 3-1). This voltage greater than or equal to a prescribed value needs only to be greater than or equal to a voltage acquired in advance at which the light-emitting element 11 starts emitting light.

If the measured current value is not zero, a computation step is performed whereby the first derivative value of the current value with respect to the voltage value, which represents the voltage dependence of the first derivative of the current value, is computed (STEP 3-2). Then, a peak determination step is performed whereby the presence/absence of a local maximum value in the voltage dependence of the first derivative of the current value is determined, that is, the voltage value at which the first derivative value $dI/dV$ with respect to voltage has a peak (local maximum value) is computed, and the presence/absence of a peak voltage value is determined (STEP 3-3). A processing step is performed whereby the light-emitting element 11 is processed on the basis of the previous determination (STEP 3-4).

There may be provided other steps including appearance inspection between the processing step (STEP 3-4) and the attaching step (STEP 4). Here, a peak voltage value of the first derivative value $dI/dV$ with respect to voltage refers to a voltage value at which the first derivative value $dI/dV$ with respect to voltage has a peak (local maximum value).

Figure 4:
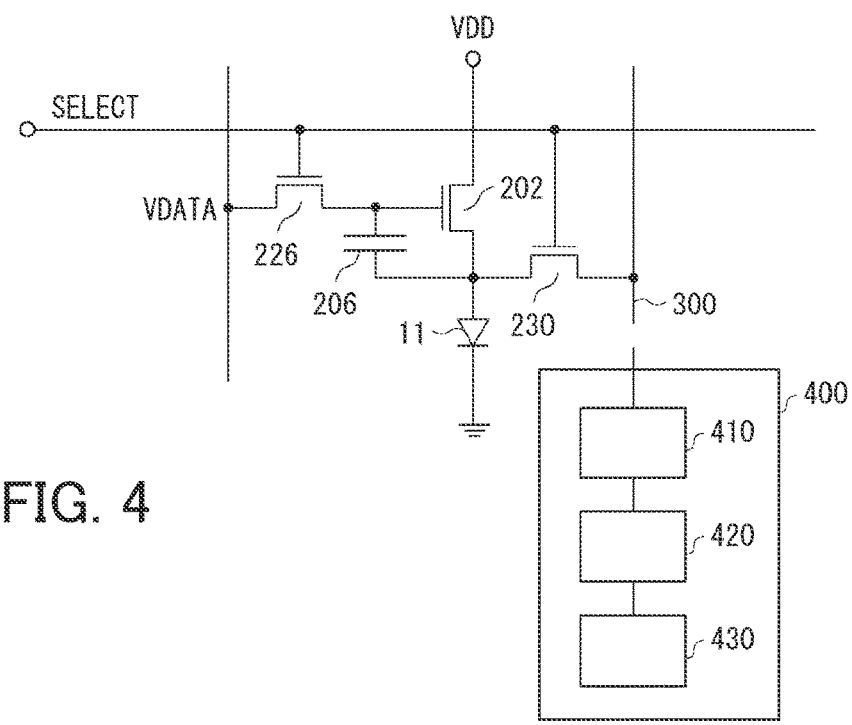
FIG. 4 is a diagram of a drive circuit for the light-emitting element and a light-on inspection device.

FIG. 4 is a diagram of a drive circuit for the light-emitting element 11 and a light-on inspection device 400. The drive circuit for the light-emitting element 11 in a QLED (quantum-dot light-emitting diode) includes a drive transistor 202, a switching transistor 226, a monitoring transistor 230, a capacitor 206, and a monitoring line 300.

The light-on inspection device 400, which performs the light-on inspection, is connected to this monitoring line 300. The light-on inspection device 400 includes a voltage supply section 410 for supplying voltage for the light-on inspection of the light-emitting element 11, a current measuring section 420 for measuring the current that flows in the light-emitting element 11, a computation unit 430 for computing the first derivative value $dI/dV$ of the current value with respect to the voltage value, and a memory section (not shown) for recording results of computation.

Figure 5:
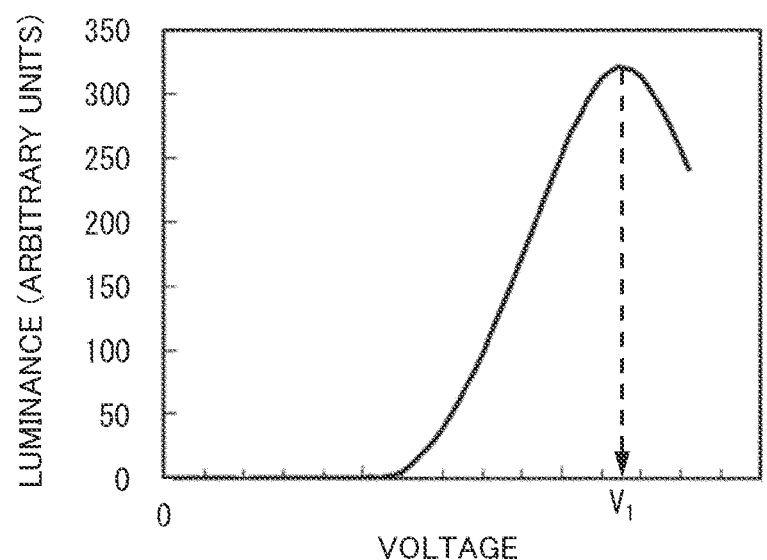
FIG. 5 is a graph representing a relationship between the voltage applied to the light-emitting element and the luminance of the light-emitting element.
Figure 6:
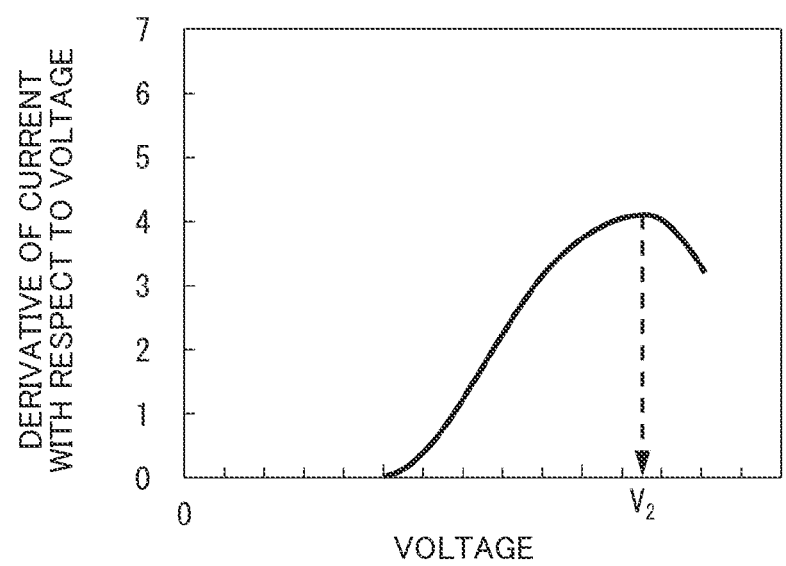
FIG. 6 is a graph representing a relationship between the voltage applied to the light-emitting element and the derivative of a current with respect to the voltage.

FIG. 5 is a graph representing a relationship between the voltage applied to the light-emitting element 11 and the luminance of the light-emitting element 11. FIG. 6 is a graph representing a relationship between the voltage applied to the light-emitting element 11 and the derivative of a current that flows in the light-emitting element 11 with respect to a voltage.

The inventors of the disclosure have found the fact that the peak voltage value $V_1$ at which the luminance of the light-emitting element 11 has a peak when a voltage that is applied to the light-emitting element 11 is swept matches the voltage value $V_2$ at a changing point of the derivative of a current that flows in the light-emitting element 11 with respect to a voltage, as shown in FIGS. 5 and 6. The light-on inspection of the light-emitting element 11 in accordance with the present embodiment has a basis in this fact found by the inventors of the disclosure.

The light-on inspection of the light-emitting element 11 is performed by the following method.

First, the light-on inspection device 400 is connected to the monitoring line 300 of the light-emitting element 11 in the QLED in the display device before shipping. Then, the following inspection is performed for each light-emitting element 11.

The voltage supply section 410 in the light-on inspection device 400 applies voltage to the light-emitting element 11 while altering the voltage value. Then, the current measuring section 420 measures the current that flows in the light-emitting element 11 at that time and transmits the measured current value to the computation unit 430. Next, the computation unit 430 computes the first derivative value dI/dV of a current value with respect to a voltage value.

The inspection step (STEP 3) in accordance with the present embodiment provides a method of manufacturing a display device involving: a measurement step (step S3-1) of sweeping a voltage to be applied greater than or equal to a prescribed value that is determined in advance to the light-emitting element 11 and measuring a current value that flows in the light-emitting element 11; a computation step (step S3-2) of the computation unit 430 calculating the first derivative value dI/dV of current with respect to voltage from the results of the measurement by the current measuring section 420; a peak determination step (step S3-3) of determining the presence/absence of a local maximum value in the voltage dependence of the first derivative of the current value, that is, computing a voltage value at which the first derivative value HAT with respect to voltage has a peak and determining the presence/absence of a peak voltage value; and a processing step (step S3-4) of processing the light-emitting element in accordance with a result thereof.

Figure 7:
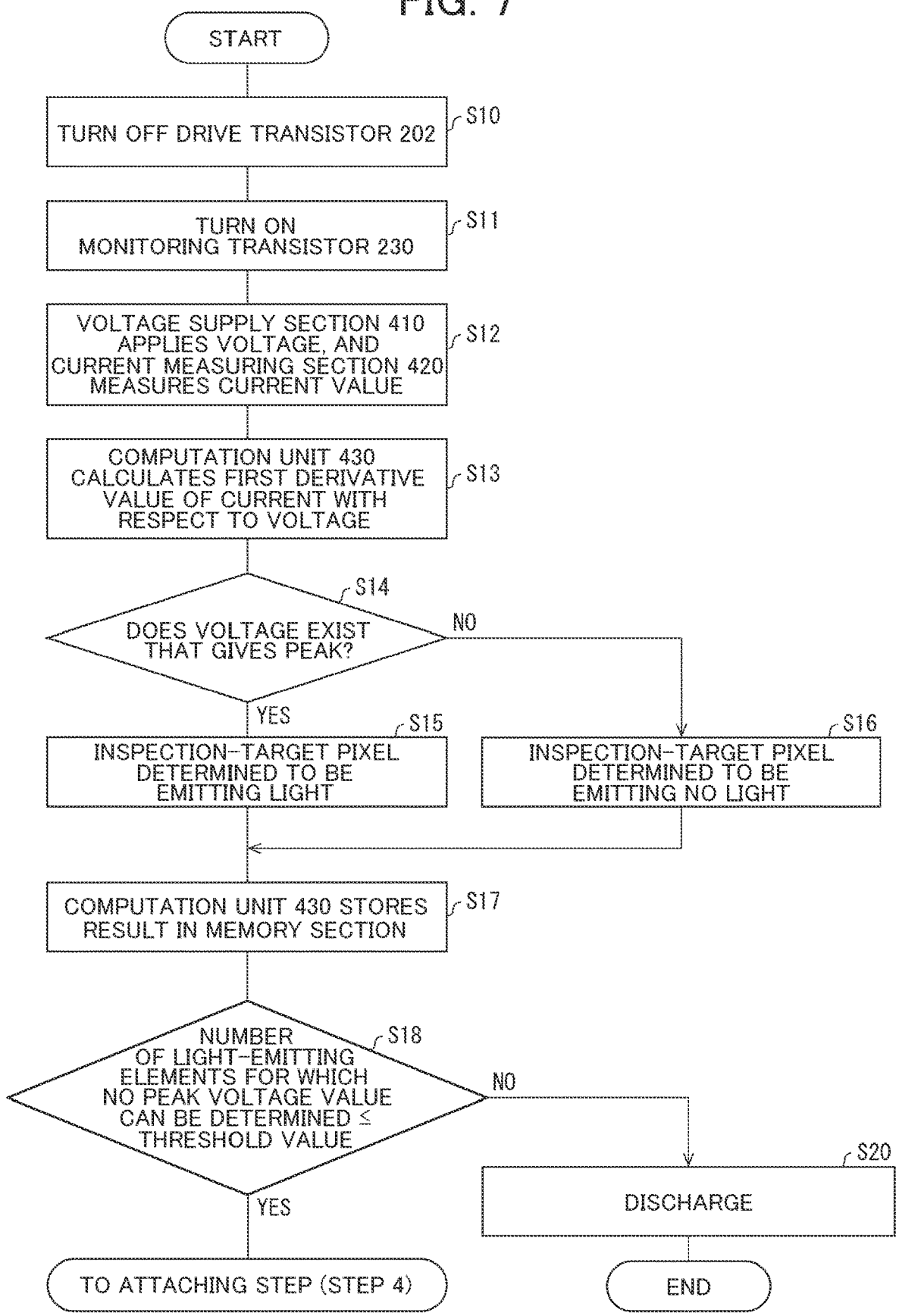
FIG. 7 is a flow chart representing a light-on inspection process for the light-emitting element.

FIG. 7 is a flow chart representing the light-on inspection process for the light-emitting element 11, The inspection step (STEP 3) in the flow chart representing the process of manufacturing a display device including the light-emitting element 11 shown in FIG. 2 is shown in further detail in FIG. 7.

A description is given next of a basic operation of an embodiment of the disclosure. First, the drive transistor 202 is turned off (step S10). Then, the monitoring transistor 230 is turned on (step S11).

Next, the voltage supply section 410 applies voltage to the light-emitting element 11 while altering the voltage value. This applied voltage needs only to be in a voltage range from the voltage acquired in advance at which the light-emitting element 11 starts emitting light to a voltage at which a peak voltage can be recognized. This configuration enables a light-on inspection in a voltage range where the light-emitting element 11 stably emits light. Then, the current measuring section 420 measures the current that flows in the light-emitting element 11 at that time and transmits the measured current value to the computation unit 430 as necessary (step S12). The process so far is an equivalent of the measurement step (STEP 3-1) in FIG. 3.

Thereafter, the computation unit 430 calculates a first derivative value of the measured current value with respect to voltage (step S13). This is an equivalent of the computation step (STEP 3-2) in FIG. 3 whereby the first derivative value of the current value with respect to the voltage value, which represents the voltage dependence of the first derivative of the current value, is computed.

Then, the computation unit 430 determines the presence/absence of a voltage value at which the first derivative value of current with respect to voltage has a peak (step S14). This is an equivalent of the peak determination step (STEP 3-3) in FIG. 3 whereby the peak voltage value of the peak of the first derivative value is determined.

In this peak determination step, if the computation unit 430 determines that there exists a voltage value at which the first derivative value with respect to voltage has a peak (YES in step S14), the computation unit 430 determines that the light-emitting element 11 in the subpixel that is a measurement target is emitting light (light-emission-capable element) (step S15) and records the result of the inspection in the memory section (step S17). If the computation unit 430 determines that that there exists no voltage value at which the first derivative value with respect to voltage has a peak (NO in step S14), the computation unit 430 determines that the light-emitting element 11 in the subpixel that is a measurement target is not emitting light (non-light-emitting element) (step S16) and records the result of the inspection in the memory section (step S17).

Next, the computation unit 430 receives this result and performs the processing step (STEP 3-4) in FIG. 3. The number of those light-emitting elements recorded in step 517 for which no peak voltage value can be determined, in other words, the number of the non-light-emitting elements, is less than or equal to a prescribed threshold value (YES in step S18), the process proceeds to the attaching step (STEP 4). In addition, the computation unit 430, if the number of those light-emitting elements recorded in step S17 for which no peak voltage value can be determined, in other words, the number of the non-light-emitting elements, exceeds the prescribed threshold value (NO in step S18), does not proceed to the attaching step (STEP 4), and the array substrate 12 on which the light-emitting elements 11 are formed is discharged (step S20), This processing step (STEP 3-4) determines whether to proceed to the attaching step (STEP 4) or to the discharge step (step S20), by step S18 on the basis of the number of those light-emitting elements recorded in step S17 for which no peak voltage value can be determined, in other words, the number of the non-light-emitting elements, and causes the process to proceed to a next step.

This prescribed threshold value is related to quality and may be set to any value in consideration of desirable specifications. In other words, in step (SN), the number of the light-emitting elements 11 (non-light-emitting elements) for which no peak voltage value (Vp) can be determined is set to n, and the threshold value is set to a predetermined value (T) using which the quality of the display device can be maintained. Then, if the number, n, of the light-emitting element 11 (non-light-emitting elements) for which no peak voltage value (Vp) can be determined is less than or equal to the threshold value T, the process is allowed to proceed to the attaching step (STEP 4). Note that step S14 may be alternatively referred to as the non-light-emitting element determining step.

These enable determining whether each light-emitting element 11 in the QLED is a light-emission-capable element or a non-light-emitting element and enable managing the quality of the display device.

According to this configuration, the light-on inspection can be performed for each light-emitting element 11 in the QLED independently of the pixel size of the display device. In addition, a light-on inspection device using a CCD camera is no longer necessary before shipping. Then, since a light-on inspection device using a CCD camera is no longer necessary, the manufacturing cost of the display device can be reduced.

Figure 8:
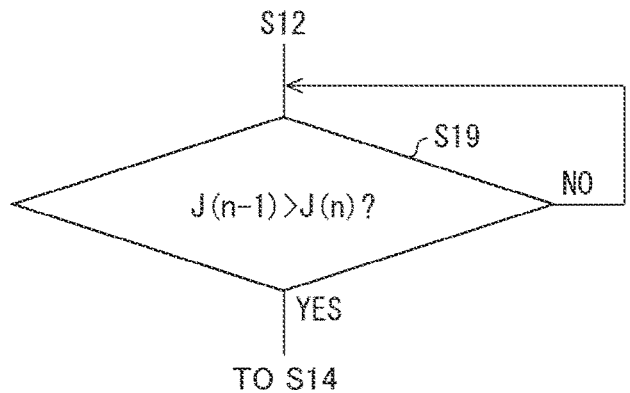
FIG. 8 is a diagram showing details of the flow chart.

FIG. 8 is a diagram showing details of step S12 to step 814 in the flow chart in FIG. 7.

The voltage supply section 410 alters the voltage value applied to the light-emitting element 11 while continuously increasing the voltage by a voltage interval of ΔV. This voltage interval ΔV needs only to be an interval from a voltage acquired in advance at which the light-emitting element 11 starts emitting light to a voltage at which a peak voltage can be recognized. For instance, letting Vn be the initial value of the voltage, and In be the current value to be measured by the current measuring section 420 at that time, the computation unit 430 computes ΔIn=I(n−1)/ΔV and designates the result of this computation as J(n) (where n is an integer). In other words, the J value of the result of the computation by the (n−1)-th voltage application is denoted by J(n−1). In addition, for convenience, n in the first measurement of voltage application is set to 1 (n=1). In the voltage application performed immediately after that, n is set to 2 (n=2).

Next, the computation unit 430 compares the magnitude of the J value and the magnitude of the immediately preceding J value. In other words, the determination formula, "J(n−1)>J(n)," is determined (step S19), and if this condition does not hold, n is incremented (i.e., the applied voltage is increased), and another light-on inspection is performed. If the determination formula, "J(n−1)>J(n)," holds, the voltage value is determined to give a peak in the voltage dependence of the first derivative value of a current value with respect to voltage.

Figure 9:
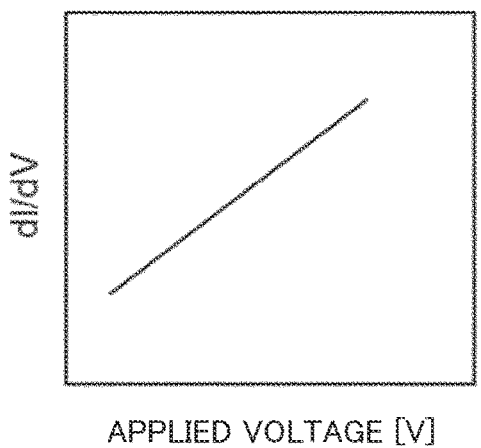
FIG. 9 is a graph representing a relationship between the voltage applied to the light-emitting element and the derivative of a current with respect to the voltage.
Figure 10:
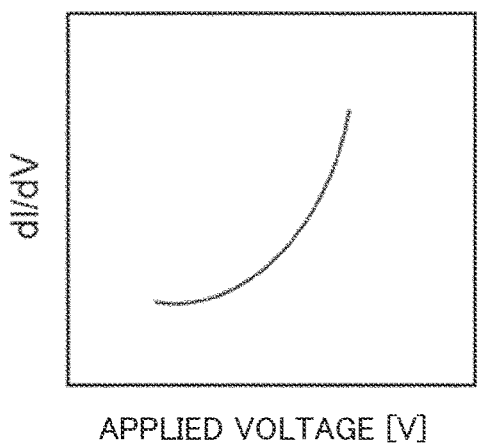
FIG. 10 is a graph representing another relationship between the voltage applied to the light-emitting element and the derivative of a current with respect to the voltage.

FIG. 9 is a graph representing a relationship between the voltage applied to the light-emitting element 11 and the derivative of a current with respect to the voltage. FIG. 10 is a graph representing another relationship between the voltage applied to the light-emitting element 11 acid the derivative of a current with respect to the voltage.

In the graph representing the voltage dependence of the first derivative value of a current value with respect to voltage, as shown in FIGS. 9 and 10, if there are monotonous increases with no peak value, no voltage value exists that satisfies the determination formula, "J(n−1)>J(n)." In addition, if the measured current value is zero, no voltage value exists again that satisfies the determination formula, "J(n−1)>J(n)." In these cases, the inspection-target pixel of the inspection-target light-emitting element 11 is determined to not be emitting light (non-light-emitting element) (NO in step 814).

The computation unit 430 calculates the first derivative value with respect to voltage and determines the presence/absence of a peak voltage value, and if a peak voltage value is determined to exist, the computation unit 430 determines that the light-emitting element 11 in the QLED is emitting light (light-emitting element). If a peak voltage value is determined to not exist, the computation unit 430 determines that the light-emitting element 11 is not emitting light (non-light-emitting element). The computation unit 430 stores the result of the evaluation in the memory section. This enables light-on inspection for each light-emitting element 11 in the QLED.

According to this configuration, the light-on inspection can be performed for each light-emitting element 11 in the QLED independently of the pixel size of the display device. In addition, a light-on inspection device using a CCD camera is no longer necessary before shipping. Then, since a light-on inspection device using a CCD camera is no longer necessary, the manufacturing cost of the display device can be reduced.

As described here, in Embodiment 1, the inspection step (STEP 3) in accordance with the present embodiment performs: a measurement step (STEP 3-1) of sweeping a voltage to be applied greater than or equal to a prescribed value that is determined in advance to the light-emitting element 11 and measuring a current value that flows in the light-emitting element 11; a computation step (STEP 3-2) of the computation unit 430 calculating the first derivative value dI/dV of current with respect to voltage from the results of the measurement by the current measuring section 420; and a peak determination step (STEP 3-3) of determining the presence/absence of a local maximum value in the voltage dependence of the first derivative of the current value, that is, the computation unit 430 computing a voltage value at which the first derivative value dI/dV with respect to voltage has a peak and determining the presence/absence of a peak voltage value, to determine whether the light-emitting element 11 is a light-emitting element or a non-light-emitting element.

It is assumed that in the dI/dV plotted for the light-emitting element 11 incapable of emitting light and for the light-emitting element 11 with a defect such as a dark spot or a bright spot, the peak voltage at which the luminance has a peak does not match the peak voltage at which the dI/dV has a peak as shown in FIGS. 5 and 6.

If the computation unit 430, which processes the light-emitting element in accordance with that result, determines, in the processing step (STEP 3-4), that the number of the non-light-emitting elements is less than or equal to the prescribed threshold value in all the light-emitting elements, the process proceeds from the processing step (STEP 3-4) to the attaching step (STEP 4). Therefore, the quality of the display device can be maintained in a satisfactory manner.

This obviates the need for a known light-on inspection device using a CCD camera and enables determining light-emission-capable elements and non-light-emitting elements from the relationship between the voltage and current that flows in the light-emitting element 11 in the QLED.

In addition, the display device may include pixels including red light-emitting elements that emit red light, green light-emitting elements that emit green light, and blue light-emitting elements that emit blue light. If the number of the non-light-emitting elements is less than or equal to the prescribed threshold value in all the light-emitting elements in the processing step (STEP 3-4), the process proceeds from the processing step (STEP 3-4) to the attaching step (STEP 4). If there is a non-light-emitting element in a pixel, the pixel loses the color balance. This disadvantageously lowers the quality of the display device.

Therefore, in the inspection step for the method of manufacturing a display device in accordance with the present embodiment, the pixels in the display device include: red light-emitting elements that emit red light, green light-emitting elements that emit green light, and blue light-emitting elements that emit blue light, and a blackening step (step S27) of blackening the light-emitting elements 11 of the other colors in the same pixel as the non-light-emitting element pixels is provided between the processing step (STEP 3-4) and the attaching step (STEP 4).

This blackening is to assign a data signal (zero data signal) that inherently represents a black display to a pixel including such a non-light-emitting element, and this enables maintaining the quality of the display device in a satisfactory manner.

Figures 11, 12, 13:
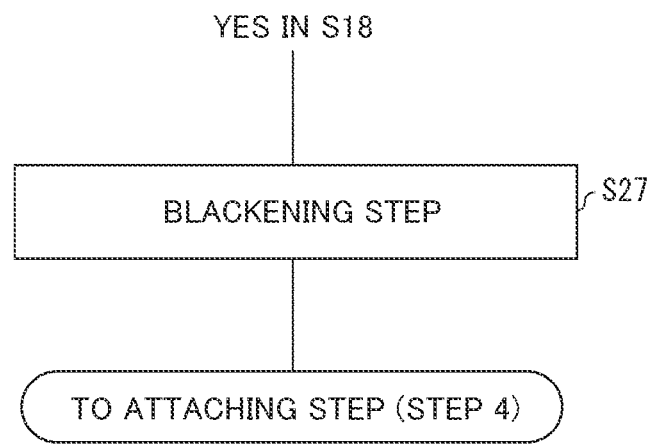
FIG. 11 is a flow chart representing a blackening step in accordance with Embodiment 1.
FIG. 12 is a diagram showing a method for the blackening step in accordance with Embodiment 1.
FIG. 13 is a diagram showing a method for the blackening step in accordance with Embodiment 1.

Specifically, a description is given of the blackening step (step S27) with reference to FIG. 11. This blackening step (step S27) is provided between "YES" in step S18 and the attaching step (STEP 4) in FIG. 7.

If the number of the non-light-emitting elements is less than or equal to the threshold value (YES in step S18) in the processing step (STEP 3-4), the computation unit 430 in the light-on inspection device 400 proceeds from the processing step (STEP 3-4) to the blackening step (step S27) and performs, in the blackening step (step S27), the following process on the light-emitting element determined to be a non-light-emitting element in step S14 and the pixel including that light-emitting element. The process assigns a data signal (zero data signal) that inherently represents a black display to the pixel including such a non-light-emitting element.

FIGS. 12 and 13 are diagrams showing a blackening method in the blackening step (step S27) for the light-on inspection method for the light-emitting element 11. In the example shown in FIG. 12, as shown in FIG. 13, an example is shown where if there is a light-emitting element 11 for red light (R) determined to be a non-light-emitting element, a zero data signal is inputted to the light-emitting elements 11 for green (G) and blue (B), which are the other colors. This enables maintaining the quality of the display device in a more satisfactory manner.

Embodiment 2

Embodiment 2 differs from Embodiment 1 in the peak determination step (STEP 3-3), whereby a peak of the light-emitting element 11 is determined on the basis of the peak voltage value in FIG. 3, and in the processing step (STEP 3-4). Specifically, a difference from Embodiment 1 lies where the computation unit 430 in the light-on inspection device 400 determines whether the light-emitting element 11 in the subpixel that is an inspection target emits light, does not emit light, or emits abnormal light in the peak determination step (STEP 3-3) by making use of the peak voltage value (V0) obtained from a luminance-voltage curve acquired in advance for the light-emitting element 11 in the QLED that is an inspection target. Another difference from Embodiment 1 lies where the light-on inspection device 400 performs the processing step (STEP 3-4) on the basis of the aforementioned result.

Figure 14:
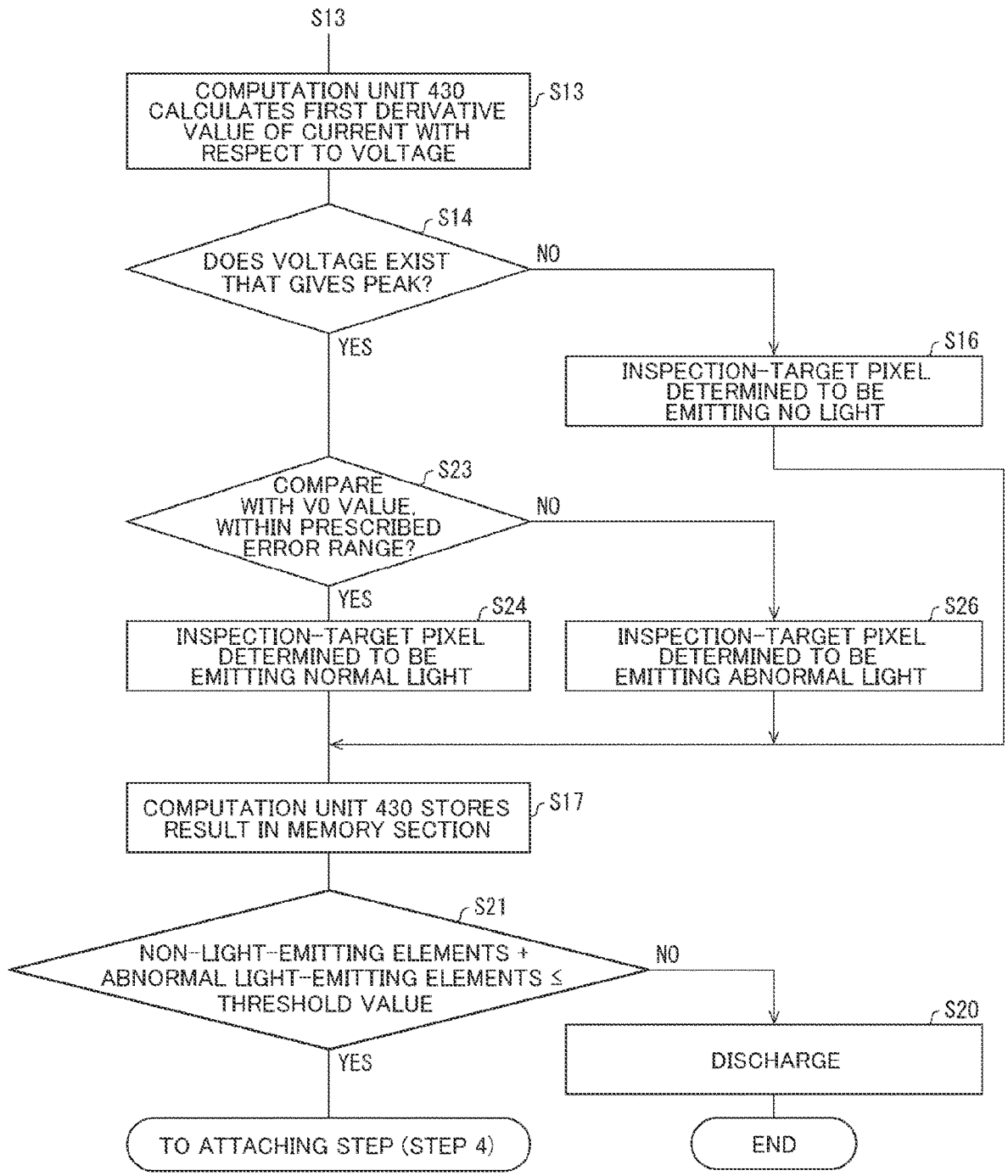
FIG. 14 is a flow chart representing a light-on inspection process for a light-emitting element in accordance with Embodiment 2.

FIG. 14 is a flow chart representing a light-on inspection process for the light-emitting element 11 in accordance with Embodiment 2. As step S10 to step S13 are the same as in FIG. 7 in Embodiment 1, detailed description thereof is omitted in relation to FIG. 14. FIG. 14 shows in further detail the inspection step (STEP 3) in the flow chart representing the process of manufacturing a display device including the light-emitting element 11 shown in FIG. 2.

A description is given next of a basic operation of Embodiment 2 of the disclosure. First, the drive transistor 202 is turned off (step S10). Then, the monitoring transistor 230 is turned on (step S11).

Next, the voltage supply section 410 applies voltage to the light-emitting element 11 while altering the voltage value. This applied voltage needs only to be in a voltage range from the voltage acquired in advance at which the light-emitting element 11 starts emitting light to a voltage at which a peak voltage can be recognized. This configuration enables a light-on inspection in a voltage range where the light-emitting element 11 stably emits light. Then, the current measuring section 420 measures the current that flows in the light-emitting element 11 at that time and transmits the measured current value to the computation unit 430 as necessary (step S12). The process so far is an equivalent of the measurement step (STEP 3-1) in FIG. 3.

Thereafter, the computation unit 430 calculates a first derivative value of the measured current value with respect to voltage (step S13). This is an equivalent of the computation step (STEP 3-2) in FIG. 3.

Then, the computation unit 430 determines the presence/absence of a voltage value at which the first derivative value of current with respect to voltage has a peak (step S14). This is an equivalent of the peak determination step (STEP 3-3) in FIG. 3 whereby the peak voltage value of the peak of the first derivative value is determined.

In this peak determination step, if the computation unit 430 determines that there exists a voltage value at which the first derivative value with respect to voltage has a peak (YES in step S14), the computation unit 430 compares the voltage value at which the first derivative value has a peak and the peak voltage value (V0) (reference value) obtained from a luminance-voltage curve acquired in advance for the light-emitting element 11 that is an inspection target to determine whether or not the difference is in a prescribed variation range (step S23).

The computation unit 430, upon determining that the difference is in a prescribed variation range by comparing the voltage value at which the first derivative value of current with respect to voltage has a peak (local maximum value) and the peak voltage value (V0) obtained from a luminance-voltage curve acquired in advance (YES in step S23), determines that the light-emitting element 11 in the subpixel that is a measurement target is emitting normal light (normal light-emitting element) (step S24) and records the result of the inspection in a memory section (step S17). Then, the computation unit 430, if the difference is out of the prescribed variation range as a result of comparison of the voltage value at which the first derivative value of current with respect to voltage has a peak and the peak voltage (V0) obtained from a luminance-voltage curve acquired in advance (NO in step 523), determines that the light-emitting element 11 in the subpixel that is a measurement target is emitting abnormal light (abnormal light-emitting element) (step S26) and records as an abnormal light-emitting point in the memory (step S17). Abnormal light emission is, as an example, a condition where light is being emitted under the application of a prescribed voltage, but with an extremely low or high luminance relative to the luminance tolerable in advance as variations.

If the computation unit 430 determines that there exists no voltage value at which the first derivative value with respect to voltage has a peak (NO in step S14), the computation unit 430 determines that the light-emitting element 11 in the subpixel that is a measurement target is not emitting light (non-light-emitting elements (step S16) and records the result of the inspection in the memory section (step S17).

Next, the computation unit 430 performs the processing step on the basis of the result recorded in step S17. If the sum of the number of the non-light-emitting elements for which no peak voltage value can be determined and the number of the abnormal light-emitting elements is less than or equal to a prescribed threshold value (YES in step S21), the process proceeds to the attaching step (STEP 4). In addition, the computation unit 430, if the sum of the number of the non-light-emitting elements for which no peak voltage value can be determined and the number of the abnormal light-emitting elements recorded in (S17) exceeds a prescribed threshold value (NO in step S21), does not proceed to the attaching step, and the array substrate 12 on which the light-emitting elements 11 are formed is discharged (step S20). This prescribed threshold value is related to quality and may be set to any value in consideration of desirable specifications. In other words, in step S21, the number of the light-emitting elements 11 (non-light-emitting elements) for which no peak voltage value (Vp) can be determined is set to n, and the number of the light-emitting elements 11 determined to be abnormal light-emitting elements is set to N. The sum value (n+N) is compared with a threshold value with a prescribed value (T) at which quality can be maintained as the display device in advance. Then, if the sum number of the light-emitting elements 11 is less than or equal to the threshold value, the process is allowed to proceed to the attaching step (STEP 4), These are an equivalent of the processing step (STEP 3-4) of performing a determination process on the light-emitting element 11 on the basis of the peak voltage value in FIG. 3.

The prescribed variations result from the properties of the light-emitting element 11 in the QLED and may be a standard deviation with an average value equal to the peak voltage (V0) obtained from a luminance-voltage curve acquired in advance for the light-emitting element 11 that is an inspection target.

In Embodiment 2, the light-on inspection device 400 can detect an abnormal light-emitting point by comparing a voltage at which the first derivative value of current with respect to voltage has a peak with a peak voltage value (V0) obtained from a luminance-voltage curve acquired in advance for the light-emitting element 11 that is an inspection target. Therefore, the light-on inspection can be more accurately performed than in Embodiment 1.

According to Embodiment 2, the light-on inspection can be performed for each light-emitting element 11 in the OILED independently of the pixel size. Then, a light-on inspection device using a CCD camera is no longer necessary before shipping.

FIG. 15 is a diagram showing details of the flow chart. Here, details of step S23 will be described. A difference from Embodiment 1 lies in that there is additional step S23 after step S14. Note that step S23 is alternatively referred to as the abnormal light-emitting element determining step.

The computation unit 430, if the difference is in a prescribed variation range as a result of comparison of the voltage value Vn at which the first derivative value of current with respect to voltage has a peak and the peak voltage value (V0) obtained from a luminance-voltage curve acquired in advance (YES in step S23), determines that the light-emitting element 11 in the subpixel that is a measurement target is emitting light (step S24) and records the result of the inspection in the memory section (step S17). The computation unit 430, upon determining that the difference is out of the prescribed variation range as a result of comparison of the voltage at which the first derivative value of current with respect to voltage has a peak and the peak voltage (V0) obtained from a luminance-voltage curve acquired in advance (NO in step S23), determines that the light-emitting element 11 in the subpixel that is a measurement target is emitting abnormal light (step S26) and records as an abnormal light-emitting point in the memory (step S17). This variation range may be set on the basis of, for example, the luminescence properties of the light-emitting element 11 in the QLED For instance, if it is possible to approximate the variations of the peak voltage (V0) obtained from a luminance-voltage curve acquired in advance by a normal distribution, it is preferred that 4σ be used where σ is a standard deviation. Specifically, letting the peak voltage (V0) be equal to the reference value and the voltage at which the first derivative value of current with respect to voltage has a peak (local maximum) be equal to a peak voltage value, the light-emitting element 11 can be determined to be a normal light-emitting element if the difference thereof is in a prescribed range (e.g., 4σ where the standard deviation is equal to σ as above) and to be an abnormal light-emitting element if the difference is out of the range.

By the light-on inspection (step S14), it is determined whether or not the value Vn of the acquired peak voltage is within the standard deviation (step S23). If the value Vii of the acquired peak voltage is within the standard deviation (YES in step S23), the light-emitting element 11 in the subpixel that is a measurement target is determined to be emitting normal light (normal light-emitting element) (step S24). In addition, if the value Vn of the acquired peak voltage is outside the standard deviation (NO in step S23), the light-emitting element 11 in the subpixel that is a measurement target is determined to be emitting abnormal light (abnormal light-emitting element) (step S26). This abnormal light emission is, as an example, a condition where light is being emitted under the application of a voltage, but with an extremely low or high luminance.

In Embodiment 2, the light-on inspection device 400 can detect an abnormal light-emitting point by comparing the peak voltage value obtained by the light-on inspection and the peak voltage value (V0) obtained from a luminance-voltage curve acquired in advance for the light-emitting element 11 that is an inspection target. Therefore, the light-on inspection can be more accurately performed than in Embodiment 1. Additionally, in addition to the determination as to the light-emission-capable element and the non-light-emitting element, it becomes possible to determine normal light emission (normal light-emitting element) and an abnormal light emission (abnormal light-emitting element). This enables more accurate management of the quality of the display device.

According to the aforementioned configuration, the light-on inspection can be performed for each light-emitting element 11 in the QLED independently of the pixel size. Then, a light-on inspection device using a CCD camera is no longer necessary before shipping.

In addition, the display device may include pixels including red light-emitting elements that emit red light, green light-emitting elements that emit green light, and blue light-emitting elements that emit blue light. If the sum of the number of the non-light-emitting elements and the number of the abnormal light-emitting elements is less than or equal to a prescribed threshold value in all the light-emitting elements in the processing step (STEP 3-4), the process proceeds from the processing step (STEP 3-4) to the attaching step (STEP 4), but if there is a non-light-emitting element or an abnormal light-emitting element in a pixel, the pixel loses the color balance. This disadvantageously lowers the quality of the display device.

Therefore, in the inspection step for the method of manufacturing a display device in accordance with the present embodiment, the pixels in the display device include: red light-emitting elements that emit red light, green light-emitting elements that emit green light, and blue light-emitting elements that emit blue light, and a blackening step (step S27) of blackening the light-emitting elements of the other colors in the same pixel as the non-light-emitting elements and the abnormal light-emitting elements is provided between the processing step (STEP 3-4) and the attaching step (STEP 4).

This blackening is to assign a data signal (zero data signal) that inherently represents a black display to a pixel including such a non-light-emitting element or abnormal light-emitting element, and this enables maintaining the quality of the display device in a satisfactory manner.

Specifically, a description is given of the blackening step (step S27) with reference to FIG. 16, This blackening step (step S27) is provided between "YES" in step 21 and the attaching step (STEP 4) in FIG. 14. If the sum of the number of the non-light-emitting elements and the abnormal light-emitting elements is less than or equal to a threshold value in the processing step (STEP 3-4) (YES in step S21), the computation unit 430 in the light-on inspection device 400 proceeds from the processing step (STEP 3-4) to the blackening step (step S27) and performs the following process on the light-emitting element 11 determined to be a non-light-emitting element in step S14, the light-emitting element determined to be an abnormal light-emitting element in step S23, and the pixel including these light-emitting elements in the blackening step (S27). The process assigns a data signal (zero data signal) that inherently represents a black display to the pixel including such a non-light-emitting element or abnormal light-emitting element.

FIGS. 17 and 18 are diagrams showing a blackening method in the blackening step (step S27) for the light-on inspection method for the light-emitting element 11. In the example shown in FIG. 17, as shown in FIG. 18, an example is shown where if there is a light-emitting element 11 for red light (R) determined to be an abnormal light-emitting element, a zero data signal is inputted to the light-emitting elements 11 for green (G) and blue (B), which are the other colors. The light-emitting element 11 determined to be a non-light-emitting element can also be blackened similarly to Embodiment 1. This enables maintaining the quality of the display device in a more satisfactory manner.

Variation Examples

If the pixels in the display device include red light-emitting elements that emit red light, green light-emitting elements that emit green light, and blue light-emitting elements that emit blue light and are arranged in stripes, the current values that flow in response to the voltages applied to the red light-emitting elements, the green light-emitting elements, and the blue light-emitting elements respectively may be simultaneously measured in the measurement step (STEP 3-1) whereby a voltage is swept to the light-emitting elements to measure the current values that flow in the light-emitting elements in response to the applied voltage values.

This enables completing the measurement step (STEP 3-1) in a shorter time, thereby reducing takt time, in comparison with when the measurement step (STEP 3-1) is performed on one light-emitting element 11 at a time.

The disclosure, in an aspect thereof, enables light-on inspection of the light-emitting elements 11 in downsized pixels at a low cost.

In addition, the process proceeds from the processing step (STEP 3-3) to the attaching step (STEP 4). By the pixels in the display device including red light-emitting elements that emit red light, green light-emitting elements that emit green light, and blue light-emitting elements that emit blue light and by providing the blackening step (step S27) of blackening the light-emitting elements of the other colors in the same pixel as the pixels including the non-light-emitting elements and the abnormal light-emitting elements between the processing step (STEP 3-3) and the attaching step (STEP 4), the quality of the display device can be maintained in a more satisfactory manner.

The disclosure, in an aspect thereof, enables light-on inspection of the light-emitting elements 11 in downsized pixels at a low cost and maintaining the quality in a more satisfactory manner.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A method of manufacturing a display device, the method comprising:
   a thin film transistor forming step of forming thin film transistors on a substrate;
   a light-emitting element forming step of forming light-emitting elements on the thin film transistors, the light-emitting elements including an anode, a light-emitting layer, and a cathode; and
   an inspection step of inspecting the light-emitting elements,
   the inspection step including:
      a measurement step of sweeping a voltage to the light-emitting elements and measuring a current value that flows in the light-emitting elements in response to a voltage value applied;
      a computation step of computing a first derivative value of the current value with respect to the voltage value, the first derivative value representing voltage dependence of a first derivative of the current value;
      a peak determination step of determining a peak of the first derivative value;
      a processing step of processing the light-emitting elements based on a result of the peak determination step; and
      an attaching step of attaching a housing to the substrate.

2. The method according to claim 1, wherein
   the display device includes pixels arranged in stripes and including red light-emitting elements that emit red light, green light-emitting elements that emit green light, and blue light-emitting elements that emit blue light, and
   the measurement step in the inspection step simultaneously measures current values that flow in the red light-emitting elements, the green light-emitting elements, and the blue light-emitting elements respectively.

3. The method according to claim 1, wherein the peak determination step determines that the light-emitting elements are light-emission-capable elements when the first derivative value has a local maximum value and that the light-emitting elements are non-light-emitting elements when the first derivative value has no local maximum value.

4. The method according to claim 3, wherein the processing step proceeds to the attaching step when the non-light-emitting elements are not greater in number than a prescribed threshold value in all the light-emitting elements in the peak determination step.

5. The method according to claim 3, wherein the peak determination step includes:
   calculating a difference between a peak voltage value at which the first derivative value has a local maximum and a reference value, determining that the light-emitting elements are normal light-emitting elements when the difference is in a prescribed range, and determining the light-emitting elements are abnormal light-emitting elements when the difference is out of the prescribed range.

6. The method according to claim 5, wherein the processing step proceeds to the attaching step when the non-light-emitting elements and the abnormal light-emitting elements are not greater in total number than a prescribed threshold value.

7. The method according to claim 4, wherein the display device includes pixels including a plurality of the light-emitting elements, and the inspection step further includes, between the processing step and the attaching step, a blackening step of blackening the light-emitting elements in those pixels which include the non-light-emitting elements.

8. The method according to claim 6, wherein the display device includes pixels including a plurality of the light-emitting elements, and the inspection step further includes, between the processing step and the attaching step, a blackening step of blackening the light-emitting elements in those pixels which include the non-light-emitting elements or the abnormal light-emitting elements.

\* \* \* \* \*